(12) United States Patent
Zominy et al.

(10) Patent No.: US 12,360,170 B2
(45) Date of Patent: Jul. 15, 2025

(54) CHARGER WITH BATTERY STATE OF HEALTH ESTIMATION

(71) Applicant: JT International S.A., Geneva (CH)

(72) Inventors: Claude Zominy, Copponex (FR); Pascal Bornel, Annemasse (FR)

(73) Assignee: JT International S.A. (CH)

( * ) Notice: Subject to any disclaimer, the term of this patent is extended or adjusted under 35 U.S.C. 154(b) by 716 days.

(21) Appl. No.: 17/290,048

(22) PCT Filed: Dec. 16, 2019

(86) PCT No.: PCT/EP2019/085412
§ 371 (c)(1),
(2) Date: Apr. 29, 2021

(87) PCT Pub. No.: WO2020/127091
PCT Pub. Date: Jun. 25, 2020

(65) Prior Publication Data
US 2021/0396816 A1  Dec. 23, 2021

(30) Foreign Application Priority Data
Dec. 21, 2018  (EP) .................................... 18215670

(51) Int. Cl.
*G01R 31/392* (2019.01)
*A24F 40/90* (2020.01)
(Continued)

(52) U.S. Cl.
CPC ............ *G01R 31/392* (2019.01); *A24F 40/90* (2020.01); *G01R 31/382* (2019.01);
(Continued)

(58) Field of Classification Search
CPC ...... H02J 7/0044; H02J 7/0048; H02J 7/0049; H02J 7/005; H02J 7/007; G01R 31/392; G01R 31/382; A24F 40/90; A24F 40/00
(Continued)

(56) References Cited

U.S. PATENT DOCUMENTS 8,269,502 B2 *  9/2012  Desprez ............... G01R 31/392
324/427
2008/0071483 A1  3/2008  Eaves
(Continued)

FOREIGN PATENT DOCUMENTS

CN  201571500 U  9/2010
GB  2377833 A  1/2003
(Continued)

OTHER PUBLICATIONS

International Search Report for Application No. PCT/EP2019/085412 mailing dated Feb. 7, 2020, 4 pages.
(Continued)

*Primary Examiner* — Lisa M Caputo
*Assistant Examiner* — Joshua L Forristall
(74) *Attorney, Agent, or Firm* — Lerner David LLP

(57) ABSTRACT

A method for charging a rechargeable battery of a device, such as an electronic cigarette, involves acquiring historical data relating to the rechargeable battery from a memory unit in the device, wherein the historical data relate to at least one previous charging operation. The method involves measuring one or more parameters related to the charging of the rechargeable battery during a charging period in which a charging voltage is applied and determining a state of health of the rechargeable battery based on the one or more measured parameters and the historical data. An action is then performed on the device based on the determined state of health.

12 Claims, 4 Drawing Sheets

(51) Int. Cl.
*G01R 31/382* (2019.01)
*H02J 7/00* (2006.01)

(52) U.S. Cl.
CPC ............ *H02J 7/0044* (2013.01); *H02J 7/005* (2020.01); *H02J 7/007* (2013.01)

(58) Field of Classification Search
USPC .......................................................... 702/63
See application file for complete search history.

(56) References Cited

U.S. PATENT DOCUMENTS

| | | |
|---|---|---|
| 2015/0181942 A1 | 7/2015 | Holzherr et al. |
| 2017/0146608 A1 | 5/2017 | Lee et al. |
| 2017/0331162 A1 | 11/2017 | Clarke et al. |
| 2018/0020727 A1* | 1/2018 | Hoffman ................ G06F 1/3296 131/328 |
| 2018/0093054 A1 | 4/2018 | Bowen et al. |
| 2019/0123574 A1* | 4/2019 | Jung ..................... H01M 10/44 |
| 2019/0170827 A1 | 6/2019 | Shoa Hassani Lashidani |
| 2020/0191876 A1* | 6/2020 | Shin .................. G01R 31/3835 |
| 2022/0013817 A1* | 1/2022 | Yan ......................... H02J 7/005 |

FOREIGN PATENT DOCUMENTS

| | | |
|---|---|---|
| JP | H06150980 A | 5/1994 |
| JP | 2000278874 A | 10/2000 |

OTHER PUBLICATIONS

Search Report dated Mar. 26, 24 from the Office Action for Chinese Application No. 201980076031.6 issued Mar. 29, 2024, pp. 1-3.

* cited by examiner

CHARGER WITH BATTERY STATE OF HEALTH ESTIMATION

CROSS-REFERENCE TO RELATED APPLICATIONS

The present application is a national phase entry under 35 U.S.C. § 371 of International Application No. PCT/EP2019/085412, filed Dec. 16, 2019, published in English, which claims priority to European Application No. 18215670.3 filed Dec. 21, 2018, the disclosures of which are incorporated herein by reference.

BACKGROUND OF THE INVENTION

The present invention relates to a method and system for determining the state of health of a battery in a device such as an electronic cigarette.

Rechargeable batteries are commonly used in devices such as electronic cigarettes. Electronic cigarettes in particular have requirements of being small so as to be convenient to use for the consumer (e.g. it is convenient if they can to some extent mimic a conventional smoking article such as a cigarette, or a cigar or a pipe etc.), in particular to enable the user to easily bring it into contact with the user's lips to draw vapour from the device etc. in a way which is comfortable for the user during smoking. Simultaneously, the battery needs to be sufficiently powerful to provide a significant amount of power to the vaporizer element so as to produce a good amount and quality of vapour. Accordingly, e-cigarettes tend to use small but relatively powerful batteries such as modern Lithium ion batteries which are continuously being developed to optimise the amount of power they can supply, the amount of charge which they can hold and the rate at which they can be recharged, for a given volume and weight of the battery (which it is desirable to keep as small as possible).

The safety of these batteries can be influenced by internal factors such as their design and method of manufacture and by external factors which relate to the way that they are used and charged. The methods of use and charging can vary widely between users and types of device and this can affect the safety and lifespan of the batteries.

The efficacy of rechargeable batteries can reduce over time after many charge and discharge cycles, and a decline in performance can be exacerbated by the way that they are used and charged. A safety concern can arise if batteries continue to be used when their performance has been diminished. An object of the present invention is to provide a technique for increasing the life of rechargeable batteries and improving their safety of use.

BRIEF SUMMARY OF THE INVENTION

According to an aspect of the present invention there is provided a method of charging a rechargeable battery of an electronic cigarette, the method comprising the steps of: acquiring historical data relating to the rechargeable battery, wherein the historical data relate to at least one previous charging operation and/or to a default data set; measuring one or more parameters related to the charging of the rechargeable battery during a charging period in which a charging voltage is applied; determining a state of health of the rechargeable battery based on the one or more measured parameters and the historical data; and performing an action on the electronic cigarette based on the determined state of health.

In this way, the charging of the device can be controlled according to the determined state of health. In particular, charging can be modified or suspended if the battery is found to be in poor health. This can increase the life of the battery and improve safety of use.

The default data set could be provided by the manufacturer and could be based on the analysis of a number of "healthy" batteries measured in a previous trial by the manufacturer, and/or the result of data sent back to the manufacturer from a number of devices in use, etc.

The state of health is determined based on the one or more measured parameters and the historical data. The state of health may be a function of one or more aspects of the historical data and one or more of the measured parameters. These parameters may be combined using a wide number of conceivable mathematical models to determine a state of health which is related to the safety of use of the battery and/or the likelihood of the battery developing a fault.

The historical data may be acquired from a memory unit, which may be located in the device or in a connected resource such as a mobile phone or a remote server. The determining is preferably performed by a processor which may be located in the device, or in a charging device, or in a connected resource such as a mobile phone, a computer or a remote server.

The state of health determined by the present techniques may represent a relative measurement of the health of the battery. Thus, the state of health may be indicative of the current health of the battery as compared to its initial health, or at least its previous health. In one example, the state of health may be analysed to determine a decline in battery performance over time.

The electronic cigarette can include one or more rechargeable batteries and recharging can be performed wirelessly or by a wired connection to a power source.

The one or more measured parameters may include a charging voltage and a charging current. The charging voltage and charging current may also be measured as a function of time. Thus, the measured parameters may include rate of change of charging voltage, rate of change of charging current and higher order differentials. In other examples, the measured parameters may include the duration of a charging cycle, open circuit voltage, internal resistance and other parameters such as battery temperature.

Preferably the method includes the step of logging the one or more measured parameters as a new entry in the historical data. In this way, the historical data can be continually updated based on new measurements undertaken during charging operations.

The method may involve the step of identifying the device. The historical data are preferably linked to a particular device. Each device may have its own unique character. A different method of determination may be deployed for state of health depending on the device being used.

The action may comprise displaying a notification if the state of health is outside a normal range. In this way, the user can be notified if the rechargeable battery is approaching the end of its usable life. This may prompt the user to replace the rechargeable battery even though it can continue to be used and charged in a modified charging mode.

Preferably the step of measuring the one or more parameters related to the charging of the rechargeable battery occurs during a pre-charging period of a predetermined duration or in which the rechargeable battery is charged up to a predetermined state of charge, in which a charging voltage is applied. The charging voltage can be applied during the pre-charging period specifically so that the one or more parameters can be measured. This means that analytical data can be acquired without subjecting the device to an extended charging period when such an extended period of charging might not be supported by the state of health of the battery. The action performed on the device may include charging the rechargeable battery for an unspecified period of time, if the state of health indicates that this action can be supported.

The rechargeable battery is preferably rested following the pre-charging period, and the step of measuring the one or more parameters is performed after the rechargeable battery is rested. In this way, the chemistry of the battery can be allowed to settle before measurements are performed. This can increase the accuracy of the measurements and the subsequent determination of state of health.

Following the pre-charging period, and the optional period of rest, the device may be partially discharged using a load that is separate to the heating element of the electronic cigarette. This can allow metrics to be determined during the at least partial discharge in order to determine state of health.

The action may comprise charging the rechargeable battery, following the pre-charging period, if the state of health is within a normal range. In another arrangement the action may comprise charging the rechargeable battery in a modified mode, following the pre-charging period, if the state of health is outside a normal range, but within an acceptable range. The modified charging mode may involve applying at least one modified charging parameter in comparison to normal charging, such as a reduced charging current, a pulsed charging current or a reduced charging voltage in order to extend the life of the rechargeable battery.

Preferably the action comprises disabling the charging of the rechargeable battery if the state of health is in an unacceptable range. This can be achieved by setting a flag in a memory unit to indicate that charging is disabled for the relevant battery, or by physically disabling charging by blowing a fuse, in one example.

According to another aspect of the present invention there is provided a system for charging a rechargeable battery of an electronic cigarette, the system comprising at least one processor configured to: acquire historical data relating to the rechargeable battery from a memory unit, wherein the historical data relate to at least one previous charging operation and/or to a default data set; measure one or more parameters related to the charging of the rechargeable battery during a charging period in which a charging voltage is applied; determine a state of health of the rechargeable battery based on the one or more measured parameters and the historical data; and perform an action on the electronic cigarette based on the determined state of health.

The at least one processor may be a microcontroller or a computer. The at least one processor may be provided in the charger, the electronic cigarette, or a computer. The functions of the processor may, of course, be distributed between several processors and the skilled person will understand that operations can be performed by a processor regardless of the processor's location.

According to yet another aspect of the invention there is provided a computer readable memory medium comprising executable instructions which, when executed by at least one processor, cause the at least one processor to: acquire historical data relating to a rechargeable battery of an electronic cigarette, wherein the historical data relate to at least one previous charging operation and/or to a default data set; measure one or more parameters related to the charging of the rechargeable battery during a charging period in which a charging voltage is applied; determine a state of health of the rechargeable battery based on the one or more measured parameters and the historical data; and perform an action on the electronic cigarette based on the determined state of health.

BRIEF DESCRIPTION OF THE DRAWINGS

Embodiments of the invention are now described, by way of example, with reference to the drawings, in which.

DETAILED DESCRIPTION

As used herein, the term "inhaler" or "electronic cigarette" may include an electronic cigarette configured to deliver an aerosol to a user, including an aerosol for smoking. An aerosol for smoking may refer to an aerosol with particle sizes of 0.5-7 microns. The particle size may be less than 10 or 7 microns. The electronic cigarette may be portable.

Figure 1C:
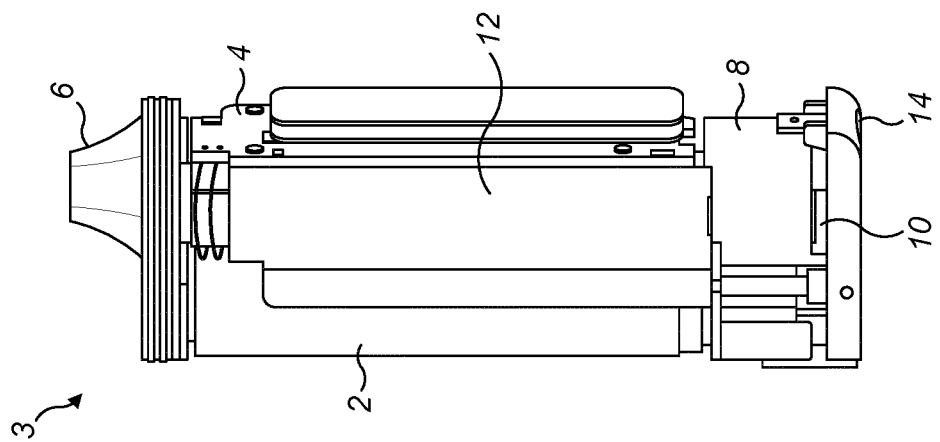
FIG. 1C is a cross-sectional view of the electronic cigarette shown in FIG. 1A.
Figure 1B:
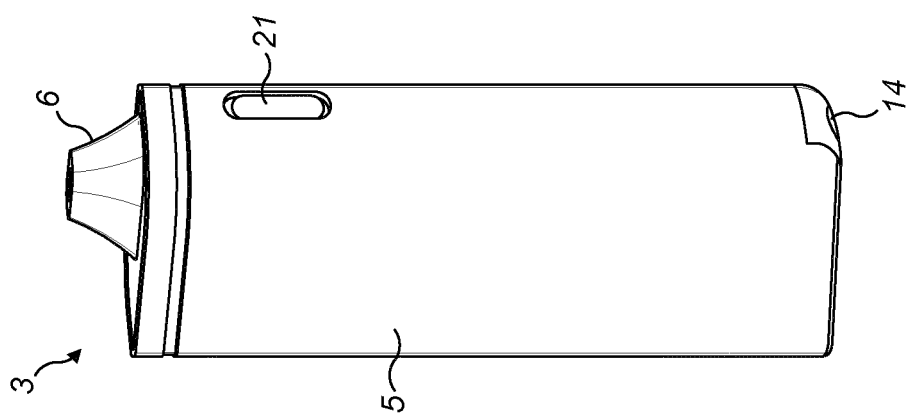
FIG. 1B is a rear perspective view of the electronic cigarette shown in FIG. 1A.
Figure 1A:
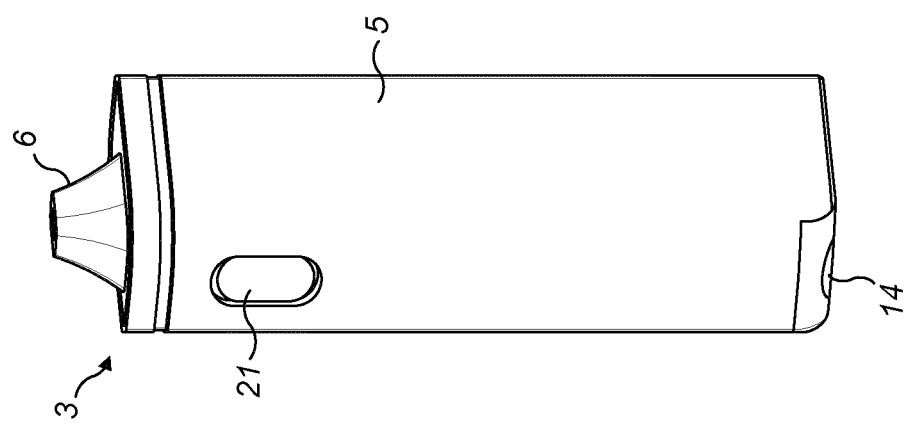
FIG. 1A is a front perspective view of an electronic cigarette in an embodiment of the invention.

FIGS. 1A-1C show an electronic cigarette 3 in an embodiment of the invention. The electronic cigarette 3 can be used as a substitute for a conventional cigarette comprising shredded tobacco. The electronic cigarette 3 comprises an elongate main body 5, a mouthpiece portion 6 and an oven 8 for receiving a stick of tobacco (not shown). The oven 8 includes an electrical heater 10 that can heat the stick of tobacco without burning it, and generate vapour. In an alternative embodiment the electronic cigarette 3 may comprise a reservoir for accommodating vaporisable liquid.

A vapour channel 12 is provided and extends between the oven 8 and the mouthpiece portion 6. The mouthpiece portion 6 is tip-shaped to correspond to the ergonomics of the user's mouth. The electronic cigarette additionally includes an air inlet 14 in fluid communication with the mouthpiece portion 6 and the vapour channel 12, whereby a user drawing on the mouthpiece portion 6 causes air to flow into the air inlet 14 and through the oven 8 and the vapour channel 12 to the mouthpiece portion 6. An activation button 21 is provided with which a user can control the production of vapour by the electrical heater 10.

The electronic cigarette includes a battery 2 which is configured to supply electrical power to the electrical heater 10, under the control of the control circuitry in a PCB 4. In one example, the battery 2 is a LTO (Lithium Titanate Oxide) cylindrically shaped battery with a capacity of 1100 mAh and provides an operating voltage when fully charged of around 2.4V.

Figure 2:
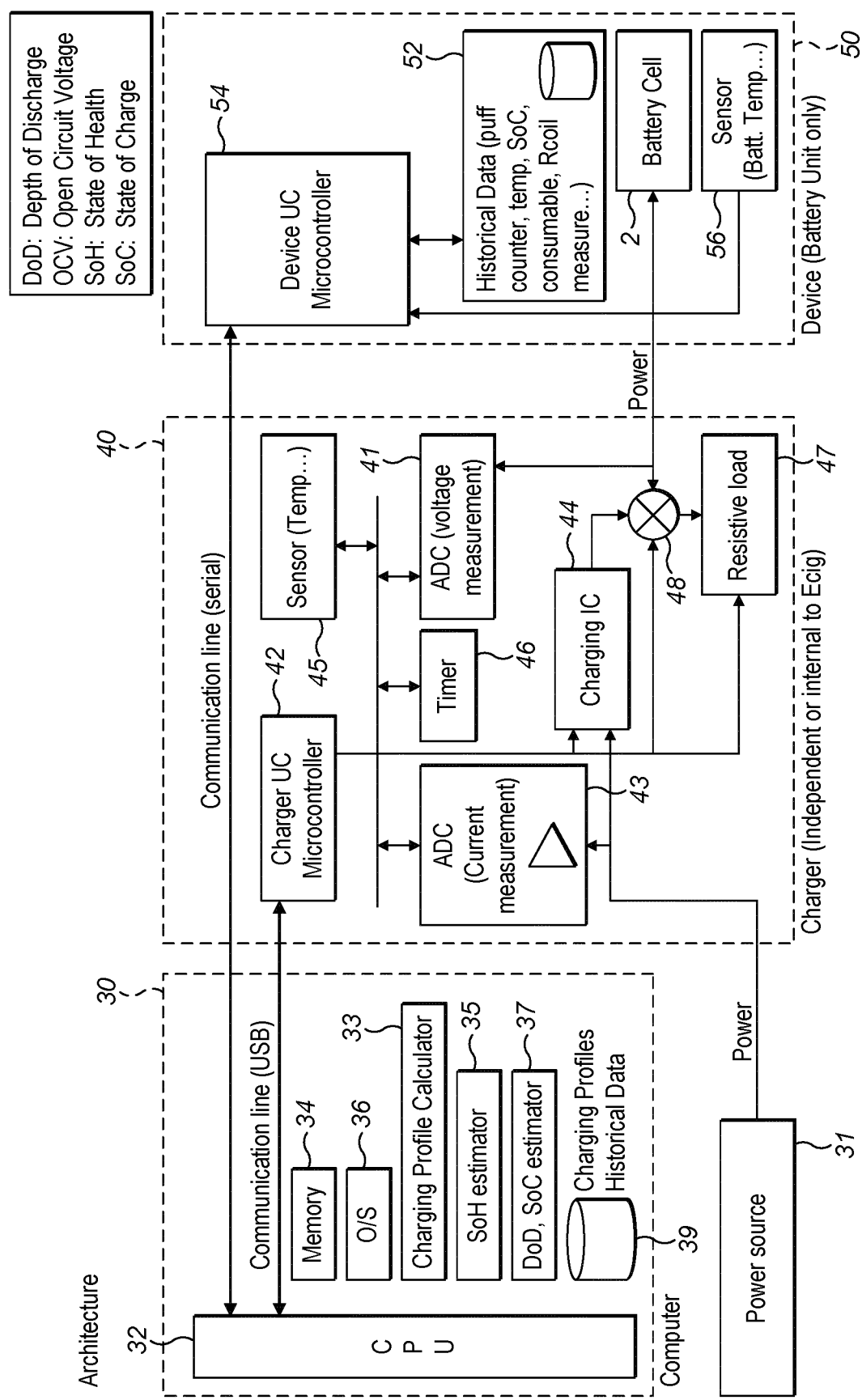
FIG. 2 is a schematic circuit diagram showing a device such as an electronic cigarette together with a charging device in an embodiment of the invention.

FIG. 2 is a schematic circuit diagram showing components that may be used in an embodiment of the invention. In this embodiment a computer 30 is connected to a device 50 via a charger 40. The charger 40 may be internal to the computer 30 or the device 50, or it could be an independent component. In one embodiment the device 50 may be the electronic cigarette 3, as described above.

The device 50 includes a rechargeable battery 2, a memory unit 52, a microcontroller 54 and one or more sensors 56, including a temperature sensor for determining the temperature of the battery 2. The memory unit 52 may be configured as flash memory storage, or any other kind of suitable memory storage device. The memory unit 52 is configured to store historical data regarding use of the device and the charging and discharging cycles. The historical data typically includes information on the number of puffs taken by the user, where the device 50 is an electronic cigarette, temperature profiles for the battery 2 and the oven 8, the state of charge of the battery 2, the type of consumable that has been used, and a measurement of the resistance of the heater in the oven 8. The historical data also include logged information for charging events that have taken place. The logged parameters can include the charging voltage, the charging current both as instantaneous values and as a function of time. In this way, the logged parameters can include rate of change of charging voltage, rate of change of charging current and higher order differentials. In other examples, the historical data can include the duration of a charging cycle and open circuit voltage. Additionally, in other examples, the historical data can include an under load voltage. This may be obtained by supplying power to a heater of the device for a sufficiently short period of time that no aerosol, or no significant amount of aerosol, is generated (preferably less than 10 milliseconds), or alternatively by measuring the voltage of the battery when a user is using the device to generate aerosol. The historical data may be expanded over time by the addition of new data derived from each charging event.

In this example embodiment the memory unit 52 is shown as part of the device 50. However, it would be equally possible to provide the memory unit 52 as part of a companion device that is communicatively connected to the device 50, such as a mobile phone. Equally, the memory unit 52 could be located in the computer 30 or remotely in a server that is accessible over a network.

The charger 40 comprises components that can charge the rechargeable battery 2 in the device 50 and can monitor electrical parameters during charging and pre-charging events. In this embodiment the charger 40 comprises a microcontroller 42, a charging integrated circuit (IC) 44 and a timer 46 that, in combination, control the charging events. A charging switch 48 is provided between the battery 2 in the device 50 and an external power source 31, which can be provided as part of the computer 30, or separately therefrom. A number of sensors are provided within the charger 40 including a voltage detector 41, a current detector 43 and a sensor 45 for measuring (environmental) temperature. The charger 40 also includes a resistive load 47 which the switch 48 can optionally connect between the battery 2 and the power source 31. When connected, the resistive load 47 is provided in series between the battery 2 and the power source 31. The resistive load 47 can also be connected to the battery 2 without any connection to the power source 31 in order to perform measurements on the battery 2. In the case that the device is the electronic cigarette 3 described above, the resistive load may be the heater of the device, or it could be independent of the heater element. In other embodiments, the load may be an impedance load rather than a purely resistive load.

The power source 31 is provided in or in parallel with the computer 30. The computer 30 also includes a central processing unit (CPU) 32, memory 34 which can be provided internally or externally, and an operating system 36, as shown schematically in FIG. 2. The computer 30 includes a number of functions which are provided in software. Specifically, the computer 30 includes a charging profile calculator 33, a state of health estimator 35 and a depth of discharge and state of charge estimator 37. Stored within the computer 30 is historical data 39 relating to the charging profiles of different devices. The historical data stored on the device 50 can be transferred to the computer 30 when the two are communicatively connected. The computer 30 can be used with a wide number of different devices, and the historical data for each device can be transferred to the computer 30 when a communicative interaction is established, which is typically, but not necessarily exclusively, during a charging event.

Figure 3:
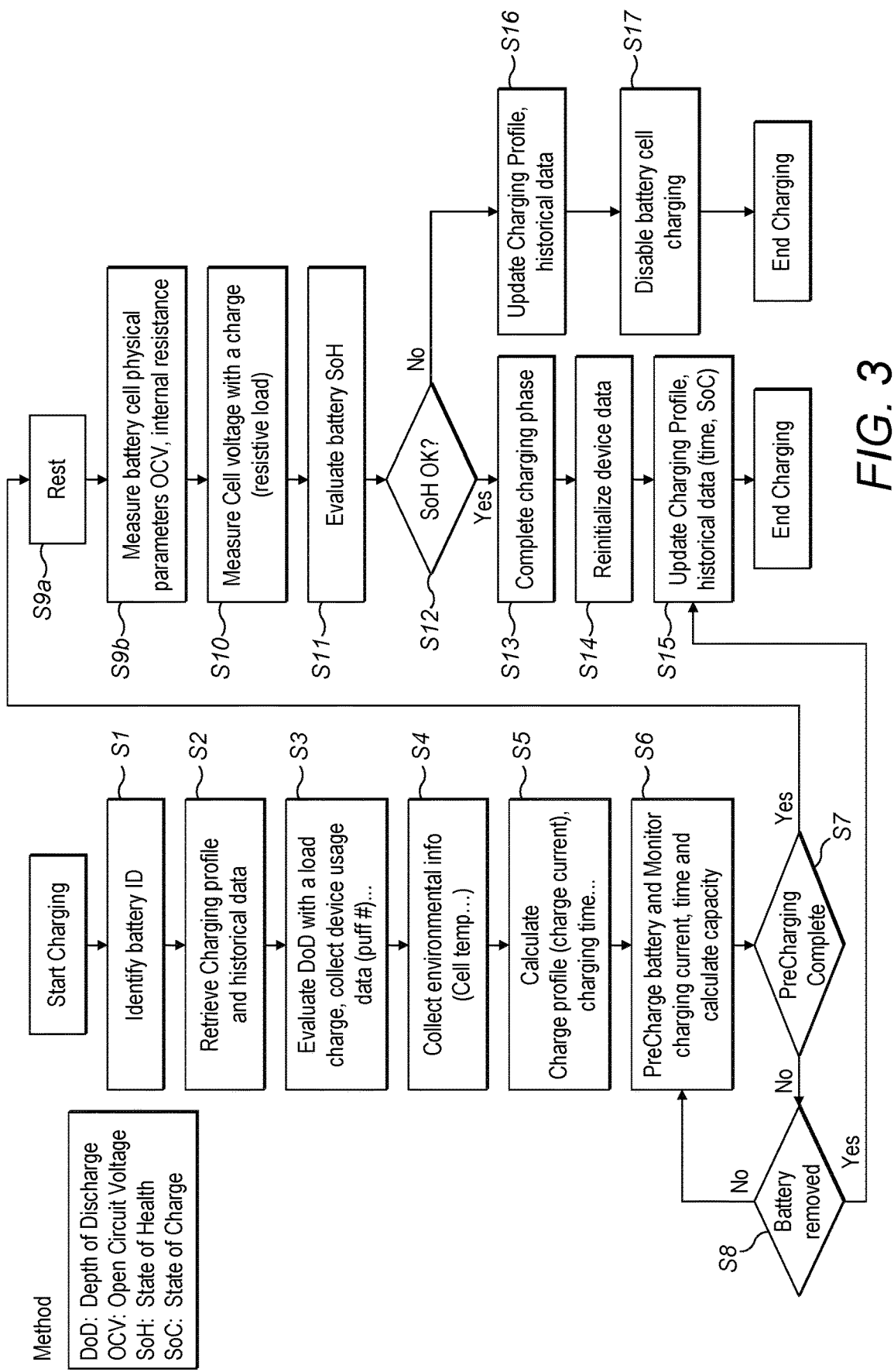
FIG. 3 is a flow diagram showing steps that can be undertaken in a method in an embodiment of the invention.

FIG. 3 is a flow diagram showing steps that can be undertaken in a method in an embodiment of the invention. The method begins when the device 50 is connected to the computer 30 and the charger 40 so that a charging event can begin. In one example, this may involve physically connecting the device 50 to the computer 30 using a cable. In another example, this may involve placing the device 50 on a wireless charging pad which is connected to the computer 30. At step 51 the CPU 32 in the computer 30 identifies the connected device 50 and its rechargeable battery 2. This can be done by detecting the serial number of the device 50 and the battery 2. At step S2 the CPU 32 downloads historical data from the memory unit 52 in the device 50 and updates any stored historical data 39 for the relevant (identified) device 50. At step S3 the microcontroller 42 in the charger 40 connects the battery 2 to the resistive load 47 so that the voltage detector 41 can measure battery cell voltage and send this information to the CPU 32. At this point the CPU 32 can correlate usage data with the measured cell voltage to estimate the depth of discharge of the battery 2. At step S4, which is optional, the microcontroller 42 in the charger 40 collects information from the device 50, which includes the temperature of the battery 2 as determined by the sensor 56. At step S5 the charging profile calculator 33 in the computer 30 calculates a charging current, a maximum charge capacity to be reached, and a time period for a pre-charge event. These calculations can be based on the historical data including the previous charging currents used, the number of charging cycles undertaken and a previous state of health determined for the relevant battery 2. In one example, the standard pre-charge voltage is around 4.2V. This may be reduced for safety reasons, based on the historical data. In one example, a pre-charge voltage of around 4.06V (which is around 80% of the standard pre-charge voltage) may be selected if the historical data indicates a decline in battery performance. The time period for a pre-charge event may also be adjusted in proportion with the pre-charge voltage.

At step S6 the microcontroller 42 in the charger 40 initiates a pre-charging event. The charging current determined at step S5 is applied for the relevant time period so that charging parameters can be monitored. In particular, the charging voltage and a charging current are monitored by the voltage detector 41 and the current sensor 43 respectively. The state of charge of the battery 2 is also monitored. Additionally, the temperature of the battery 2 and the environmental temperature can be monitored. At the end of the relevant time period the pre-charge ends and the charging current is stopped.

Figure 4:
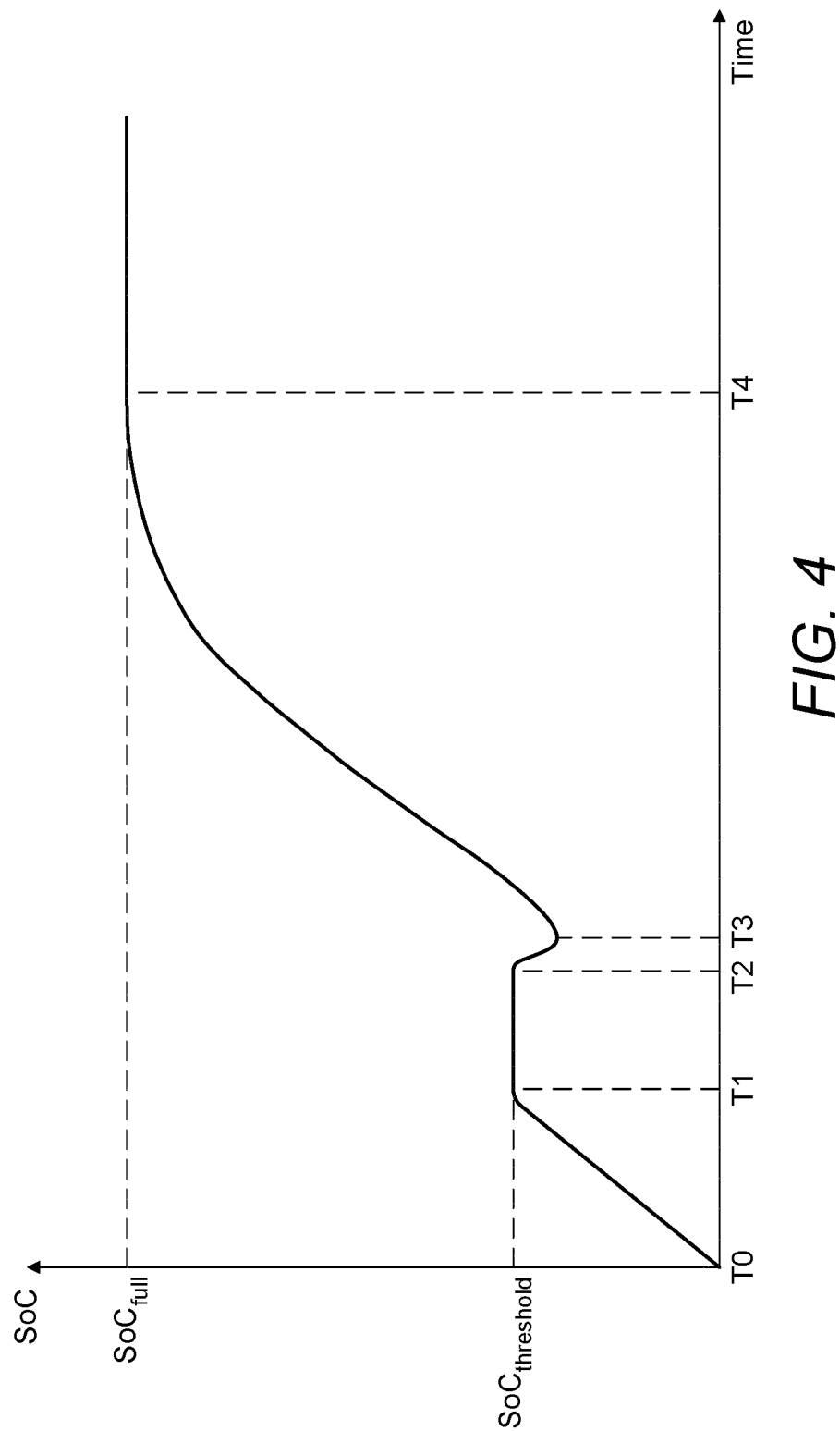
FIG. 4 is a graph showing an example of a charging operation in which state of charge is plotted against time in an embodiment of the invention.

In one embodiment, at step S6, the pre-charging is applied so that the battery 2 is charged to a predetermined SoC. For example, the battery 2 can be charged to a predetermined level at 30-40% SoC_Full. FIG. 4 is a schematic graph showing the SoC of the battery 2, plotted against time, in a charging operation. In a first time period from T0 to T1 the SoC increases during the pre-charging event until it reaches a predetermined threshold, $SOC_{threshold}$, which may be 30-40% SoC_Full. The predetermined threshold may be selected to ensure that the battery 2 has been charged sufficiently to be able to measure cell voltage effectively in a discharging event, as shall be described below in relation to step S10.

At step S7 the microcontroller 42 checks that the pre-charging event has been completed, which means that pre-charging was performed successfully for the relevant time period. If pre-charging was not completed then the microcontroller checks at step S8 whether the battery 2 was disconnected from the charger 40. If the battery 2 was not removed then pre-charging is attempted again at step S6. If the battery was removed then the charging event is ended and the relevant data acquired during the pre-charge event are added to the historical data in the device 50 and/or the computer 30.

At step S9a, and upon successful completion of a pre-charge event, the battery 2 is rested for a predetermined relaxation time period from T1 to T2 to allow the battery to stabilise, and to allow any chemical reactions to be completed before any measurements are undertaken. In embodiments the predetermined relaxation time period may be 10-15 minutes, or 15-30 minutes, or another value depending on battery or design considerations.

At step S9b, following the period of rest, the microcontroller 42 measures battery 2 open circuit voltage and the internal resistance of the battery 2 in DC and AC modes. At step S10 the microcontroller 42 operates the switch 48 to connect the battery 2 to the resistive load 47 in order to measure battery cell voltage under load. In other words, at step S10 the battery is partially discharged via the resistive load 47 for a third time period from T2 to T3, with reference to FIG. 4. The temperature of the battery 2 and the environmental temperature can also be determined by the microcontroller 42 at step S10, using the relevant temperature sensors 45, 56. Measurements, including temperature, are preferably performed with high resolution, using an analogue to digital converter operating at 12 bits on a range of 5° C. to 50° C. The skilled person will recognise that other resolutions can be used such as 10 bits or 14 bits. By performing measurements at a high resolution it is possible to obtain more accurate information to determine SoH more precisely and achieve an improved charging performance. At step S11 the microcontroller 42 sends the acquired data to the computer 30. The state of health estimator 35 in the computer then estimates the battery's state of health. The state of health is determined based on the measured parameters from the pre-charge event and the historical data acquired from the memory 52 in the device. A wide number of mathematical models can be used to determine state of health in different embodiments. The determined value for state of health is calculated based on a function of one or more aspects of the historical data and one or more of the measured parameters to determine a metric which is related to the safety of use of the battery and/or the likelihood of the battery developing a fault. The algorithms and/or data used in the state of health estimator 35 can be downloaded from, or can be updated by, a web server over the internet. This allows firmware in the charger to be updated so that new and improved algorithms or data can be deployed when they become available. In one example, the state of health estimator 35 can make use of actual data from other batteries used in similar devices in the field. These data may be uploaded by other devices to a web server, from which the data can be accessed. In this way, state of health of the battery can be evaluated in relation to data determined from charging and discharging cycles from similar batteries in other devices that are in use around the world.

In one simple example of a determination of a state of health of the battery, the following steps may be performed. First a base value for a state of health related parameter is determined. This can be done at the time of manufacture as part of the assembly and test process or it can be done the first time the user performs a charge. To do this, the system estimates a level of charge of the battery (this can be done by measuring the on-load and/or open circuit battery voltage of the battery and comparing this with pre-specified on-load and/or open circuit battery voltages associated with different levels of state of charge, or by a specialist method provided by the battery manufacturer specifically for the battery). Using this method of estimating state of charge of the battery, the method proceeds with measuring the on-load cell voltage after discharging the battery through a fixed load for a fixed time period. Then a ratio is calculated based on the voltage drop. This ratio is calculated for different levels of state of charge (e.g. at 25% State of Charge (SoC), 50% SoC, 75% SoC and when fully charged (determined by when the charging stops)). These ratios between voltage drop measurements form a set of baseline measurements. During each subsequent charging event, a state of health parameter is calculated by taking fresh measurements during the charging event, calculating voltage drop ratios and comparing these with the (historic) baseline ratios. A state of health value is determined based on this comparison. For example, in an embodiment, the state of health value is set to "Bad" if the average ratio at all of the different SoC measurement points increase above the average (historic) baseline ratios at the different SoC measurement points by more than a first pre-determined amount (e.g. of 30%) or if the ratio at any one SoC measurement point increases above the corresponding (historic) baseline ratio at that SoC measurement point by more than a second predetermined amount (e.g. of 40%). An intermediate state of health value can be calculated based on the amount of the increase in average ratio above between the two extremes of zero increase and 30% increase.

For example, the following baseline ratios could be determined on a first charging event: at 25% SoC 3.5V–3.2V/3.5V=0.085; 50% SoC 3.8–3.7V/3.8V=0.026; 75% SoC 4.15–4.14V/4.15V=0.002; 100% SoC 4.2–4.18V/4.2V=0.004. Average baseline ratio=(0.085+0.026+0.002+0.004)/4=0.029

When the battery is nearing the end of its life the following measurements might be made: 25% SoC 3.1–2.8V/3.1V=0.096; 50% SoC 3.4–3.1V/3.4V=0.088; 75% SoC 3.8–3.6V/3.8V=0.052; SoC 100% 4.2–3.9V/4.2V=0.071. Average ratio=(0.096+0.088+0.0052+0.071)/4=0.076

A look-up table with data generated from battery cells with different state of health, helps to determine for a given ratio the corresponding SoH, 0.029 corresponding to a SoH of 100% and 0.076 to a SoH of 37%.

In an example embodiment, a calculated state of health of less than 40% (such as in the above set out example) could be enough to trigger an action such as reducing the charging current during a fixed current charging stage and reducing the charging voltage during a fixed voltage charging stage in order to protect the battery from damage during charging. Simultaneously it could cause a warning to the user that the battery is approaching the end of its life and it is time for the user to purchase a new battery (or a new device if it is not possible to replace the battery, etc.). Similarly, in such an example embodiment, a state of health of 0% or less would cause the device to disable the battery from being further charged and issue a warning to the user that the battery now needs to be changed and the device cannot function further until the battery is replaced (or the device replaced if no battery change is possible) etc.

At step S12 the CPU 32 determines whether the state of health metric is within a normal range. If the state of health is normal then, at step S13, charging is initiated. Thus, normal charging of the battery 2 is initiated only once pre-charging is complete and the CPU 32 has determined that the state of health is satisfactory for safe charging. Normal charging is applied for a fourth time period from T3 to T4, with reference to FIG. 4, until the SoC is 100%, or close to 100%. At step S14 device data are reinitialised once the charging operation is complete. At step S15 the relevant data acquired during the charging event are added as entries in the historical data stored in the memory unit 52 in the device 50, during a fifth time period, for time periods after T4, once the battery 2 is fully charged. This completes the charging event for the device 50.

If, at step S12, the state of health is found to be outside a normal range (and within an unacceptable range) then, at step S16, the historical data stored at the computer 30 and the device 50 are updated with the relevant diagnostic data. At step S17 battery charging is disabled. This can be achieved by setting a flag in the memory unit 52 of the device 50 which prevents future charge events. Alternatively, charge events can be physically disabled, for example by blowing a fuse or activating a switch.

In another arrangement, at step S12, the CPU 32 can determine whether the state of health metric is outside of a normal range, but within an acceptable range. In this situation, a modified charging phase can be initiated. In a modified charging phase it may be possible to apply a reduced charging current, in comparison to normal charging. This may extend the time required to complete charging, but can prolong the working life and safety of use of a battery 2 which has reduced performance. The charging current may be reduced in terms of its absolute value, or a pulsed charge may be applied with selected time gaps between pulses. The charging current may be reduced by around 20-30% in some arrangements. The amount by which the charging current is reduced may depend on the SoH value. Stepped reductions in charging current or voltage can be applied based on the SoH value. For example, in some embodiments, the charging current may be reduced by up to around 50% for particularly poor SoH values. It may also be possible to apply a reduced charging voltage, which is around 80% of the normal charging voltage. For example, the reduced charging voltage may be 4.06V, whereas normal charging voltage is 4.2V.

A display (not shown) may be provided for displaying information about the state of health metric. In one example, where a modified charging phase is initiated, the display may provide a notification that the rechargeable battery 2 is approaching the end of its usable life. This may prompt the user to replace the rechargeable battery even though it can continue to be used in a modified charging mode. The display may provide a notification that the rechargeable battery 2 must be replaced where it has been determined that the state of health is within an unacceptable range.

The state of health determination may consume computational resource or may prolong the charging time, and therefore it may be desirable to schedule state of health evaluation on a periodic basis, rather than during every charge event. In one example, state of health evaluation can be scheduled on a weekly or monthly basis, or it may be performed upon specific request from a user. This can ensure safe operation of the battery without impeding normal use.

The invention claimed is:

1. A method of charging a rechargeable battery of an electronic cigarette, the method comprising the steps of:
    acquiring historical data relating to the rechargeable battery, wherein the historical data relate to at least one previous charging operation and/or to a default data set;
    charging the rechargeable battery during a first period in which the rechargeable battery is charged up to 30-40% of a full state of charge in which a charging voltage is applied;
    stopping the charging voltage and resting the rechargeable battery following the first period;
    at least partially discharging the rechargeable battery following the step of resting the rechargeable battery;
    measuring one or more parameters related to the charging of the rechargeable battery during the step of at least partially discharging the rechargeable battery;
    determining a state of health of the rechargeable battery based on the one or more measured parameters and the historical data; and
    performing an action on the electronic cigarette based on the determined state of health.

2. The method of claim 1, wherein the one or more measured parameters include one or more of a charging voltage and a charging current.

3. The method of claim 1, wherein the one or more measured parameters include open circuit voltage in the rechargeable battery.

4. The method of claim 1, comprising the step of logging the one or more measured parameters as a new entry in the historical data.

5. The method of claim 1, further comprising the step of identifying the electronic cigarette.

6. The method of claim 1, wherein the action comprises displaying a notification when the state of health is outside a normal range.

7. The method of claim 1, wherein the step of at least partially discharging the rechargeable battery is performed by connecting the rechargeable battery to a resistive load that is separate to a main electrical heating element in the electronic cigarette.

8. The method of claim 1, wherein the action comprises charging the rechargeable battery, following the first period, when the state of health is within a normal range.

9. The method of claim 1, wherein the action comprises disabling the charging of the rechargeable battery when the state of health is in an unacceptable range.

10. The method of claim 1, wherein the action comprises charging the rechargeable battery in a modified mode, in which at least one charging parameter is modified in comparison to normal charging, following the first period, when the state of health is outside a normal range.

11. A system for charging a rechargeable battery of an electronic cigarette, the system comprising at least one processor configured to:
    acquire historical data relating to the rechargeable battery from a memory unit, wherein the historical data relate to at least one previous charging operation and/or to a default data set;

charge the rechargeable battery during a first period in which the rechargeable battery is charged up to 30-40% of a full state of charge in which a charging voltage is applied;

stop the charging voltage and rest the rechargeable battery following the pre chargingfirst period;

at least partially discharge the rechargeable battery following the step of resting the rechargeable battery;

measure one or more parameters related to the charging of the rechargeable battery during the step of at least partially discharging the rechargeable battery;

determine a state of health of the rechargeable battery based on the one or more measured parameters and the historical data; and perform an action on the electronic cigarette based on the determined state of health.

12. A computer readable memory medium comprising executable instructions which, when executed by at least one processor, cause the at least one processor to:

acquire historical data relating to a rechargeable battery of an electronic cigarette, wherein the historical data relate to at least one previous charging operation and/or to a default data set;

charge the rechargeable battery during a first period in which the rechargeable battery is charged up to 30-40% of a full state of charge in which a charging voltage is applied;

stop the charging voltage and rest the rechargeable battery following the pre chargingfirst period;

at least partially discharge the rechargeable battery following the step of resting the rechargeable battery;

measure one or more parameters related to the charging of the rechargeable battery during the step of at least partially discharging the rechargeable battery;

determine a state of health of the rechargeable battery based on the one or more measured parameters and the historical data; and perform an action on the electronic cigarette based on the determined state of health.

* * * * *